US008865484B2

(12) United States Patent
Mathur et al.

(10) Patent No.: US 8,865,484 B2
(45) Date of Patent: Oct. 21, 2014

(54) METHODS FOR FORMING TEMPLATED MATERIALS

(71) Applicant: Intermolecular, Inc., San Jose, CA (US)

(72) Inventors: Monica Mathur, San Jose, CA (US); Michael Miller, San Jose, CA (US); Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 120 days.

(21) Appl. No.: 13/727,237

(22) Filed: Dec. 26, 2012

(65) Prior Publication Data

US 2014/0179033 A1    Jun. 26, 2014

(51) Int. Cl.
*H01L 21/66* (2006.01)
(52) U.S. Cl.
CPC ...................................... *H01L 22/14* (2013.01)
USPC .............................. 438/17; 438/18; 438/488

(58) Field of Classification Search
USPC ................................ 438/14, 17, 18, 488, 489
See application file for complete search history.

(56) References Cited

U.S. PATENT DOCUMENTS

| 7,824,935 | B2 * | 11/2010 | Verma et al. | 438/18 |
| 8,143,619 | B2 * | 3/2012 | Verma et al. | 257/48 |
| 8,163,631 | B2 * | 4/2012 | Chiang et al. | 438/478 |
| 2007/0202614 | A1 * | 8/2007 | Chiang et al. | 438/14 |
| 2009/0155936 | A1 * | 6/2009 | Weiner et al. | 438/17 |

* cited by examiner

*Primary Examiner* — Kevin M Picardat

(57) ABSTRACT

Methods of forming layers can comprise defining a plurality of discrete site-isolated regions (SIRs) on a substrate, forming a first layer on one of the discrete SIRs, forming a second layer on the first layer, measuring a lattice parameter or an electrical property of the second layer, The process parameters for the formation of the first layer are varied in a combinatorial manner between different discrete SIRs to explore the possible layers that can result in suitable lattice matching for second layer of a desired crystalline structure.

19 Claims, 9 Drawing Sheets

METHODS FOR FORMING TEMPLATED MATERIALS

CROSS REFERENCE TO RELATED APPLICATIONS

This application is related to commonly owned U.S. patent application Ser. No. 13/706,648, filed Dec. 6, 2012; Ser. No. 13/339,648, filed Dec. 29, 2011; Ser. No. 13/444,100, filed Apr. 11, 2012; Ser. No. 13/670,269, filed Nov. 6, 2012; Ser. No. 13/546,672, filed Jul. 11, 2012; Ser. No. 13/339,563, filed Dec. 29, 2011; Ser. No. 13/328,129, filed Dec. 16, 2011; Ser. No. 13/281,316, filed Oct. 25, 2011; Ser. No. 13/223,950, filed Sep. 1, 2011; and Ser. No. 13/353,000, filed Jan. 18, 2012; which are herein incorporated by reference.

FIELD OF THE INVENTION

One or more embodiments of the present invention relate to process development methods for preparing electronic and optoelectronic devices.

BACKGROUND

Development processes for the preparation of electronic and optoelectronic devices are typically serial in nature. Thin films with desired crystal structure can be grown using a template, i.e., using substrates that match the lattice constant of deposited film. For example, for preparation of DRAM capacitors, a high-κ rutile phase of $TiO_x$ is prepared only when $TiO_x$ is deposited on a lattice matched substrate such as $RuO_2$. However, developing materials systems or thin film stacks using templated substrates can be a very time consuming and costly process. First, a substrate film is developed that meets certain criteria, for example, exhibiting the desired crystal structure. Once the desired film has been formed, the deposited film and stack properties are evaluated. This process is slow, inefficient and costly, requiring many substrates and numerous deposition experiments to be performed serially.

High-κ materials are in increased demand for use in metal-insulator-metal (MIM) structures such as capacitors used for dynamic random access memory (DRAM) and field effect transistor (FET) gate structures. The feature sizes of next generation devices require scaling of the effective oxide thickness (EOT). For example, Barium-strontium titanate $(Ba,Sr)TiO_3$ (BST) thin films are of interest for their potentially ultrahigh dielectric constant (κ≈300), but the BST dielectric constant is strongly dependent on thickness, and decreases to ~16 for a 20 nm thick film on a Ru bottom electrode. BST formed on TaSiN barrier layers was amorphous, whereas high-κ is only obtained for well-crystallized materials. The crystalline form has a perovskite lattice structure. Growing BST thin films on base-metal substrates has been attempted to lower material cost, but high temperature annealing (400-750° C.) in oxidizing ambient is necessary for making BST with a high dielectric constant, and interfacial layers are introduced due to oxidation of the base-metal electrodes, resulting in a high EOT, which makes BST/base-metal stacks ineffective and undesirable. Kim et al. ("Capacitors with an Equivalent Oxide Thickness of <0.5 nm for Nanoscale Electronic Semiconductor Memory," 2010 *Adv. Funct. Mater.* 20, 2989-3003) provide an extensive discussion of why dielectric constant can be a strong function of layer thickness. The interfacial layers mentioned above are believed to create a "dielectric dead layer" such that the region does not function as the desired dielectric medium. The dead layer is believed to be caused by a variety of effects including dislocations, secondary phases, interdiffusion, and imperfect electrode-dielectric interfaces. The defects can be in the dielectric, the electrode or both. Careful attention to the electrode-dielectric interface can reduce the effects by minimizing crystalline defects and sharpening the interface by minimizing interdiffusion.

In another example, the high dielectric constant of rutile phase $TiO_2$ (up to κ≈114 for films with random texture), decreased thickness dependence, and low dielectric loss make it an attractive high-κ material. However, $TiO_2$ thin films grown by both physical vapor deposition and chemical vapor deposition usually have anatase or amorphous structures, which only have a moderately high dielectric constant (20≤κ≤40). High temperature annealing (above 700° C.) is required to transform them to the rutile phase, which requires high thermal budgets and causes structural integrity problems. Atomic layer deposition (ALD) with halide-based precursors can deposit rutile-structured $TiO_2$, but residual halide impurity causes the films to have high leakage currents. The as-deposited rutile $TiO_2$ films have been formed only in a few systems with substrates such as oxidized noble metals (Ru and Ir) or $RuO_2$ and insulating single-crystal oxides (sapphire (001) and MgO (001)). These substrates have lattice planes matching rutile $TiO_2$ that make nucleation of the rutile phase kinetically preferable to the anatase phase.

Wang et al. demonstrated that thin films of high dielectric constant (κ≈68) rutile phase titanium dioxide ($TiO_2$) could be grown epitaxially on tin dioxide substrates. (Wang, H., et al., 2010 *Electrochemical and Solid-State Letters*, 13, G75-78). Atomic layer deposition at 250° C. was used with titanium (IV) tetrakis(isopropoxide) and hydrogen peroxide as precursors. The rutile $TiO_2$ thin films were shown to have crystalline grains that match the structure and orientation of the grains in the polycrystalline rutile phase $SnO_2$ substrates. The epitaxial relations were identified from the continuous lattice fringes across the interfaces.

SUMMARY OF THE INVENTION

Embodiments of the present invention include novel methods of process development, providing the ability to expedite the process development of templated materials. Despite the promising examples described above, the high cost of time and material investment required to development these materials impedes progress. High Productivity Combinatorial (HPC™) methods can provide improved and enhanced process development.

In some embodiments, HPC methods of forming templated layers comprise defining a plurality of discrete site-isolated regions (SIRs) on a substrate, forming a first layer on one or more of the discrete SIRs, forming a second layer on the first layer, and measuring a lattice parameter or an electrical property of the second layer. The process parameters for the formation of the first layer are varied in a combinatorial manner between different discrete SIRs. Optionally, the process parameters for the formation of the second layer can also be varied in a combinatorial manner between different discrete SIRs. Example process parameters that can be varied include process material amounts, reactant species, precursor species, processing temperatures, processing times, processing pressures, substrate bias, substrate temperature, sputtering target composition, magnetron power, atmospheres in which the processes are conducted, plasma composition, plasma energy, and order in which materials are deposited.

In some embodiments, a material and desired crystalline structure for the first layer is selected such that the first layer is a candidate for a template layer for a second layer of a desired composition and crystalline structure. Success can be measured by comparing the measured lattice parameter to lattice parameters of a desired crystalline structure or comparing the measured electrical property to an electrical property correlated with the formation of a desired crystalline structure. The measurements can be made on one of the layers or on the combined layers.

One or more layers can be formed by atomic layer deposition (ALD) or chemical vapor deposition (CVD) in a system operable to deliver varying gas compositions to different discrete SIRs. One or more layers can be formed by physical vapor deposition (PVD) in a system operable to deposit layers of varying composition in different discrete SIRs. One or more layers can be formed by plasma deposition in a system operable to deliver varying plasma compositions or energies to different discrete SIRs. One or more layers can be treated with a plasma in a system operable to deliver varying plasma compositions or energies to different discrete SIRs. One or more layers can be heated during or after the forming in a system operable to deliver varying heat treatment or energies to different discrete SIRs. One or more layers can be cooled during or after the forming in a system operable to control temperature of different discrete SIRs.

In some embodiments, the lattice parameters of the second layer formed by at least one set of the combinatorial processing parameters on at least one SIR are within 2% of the lattice parameters of the desired crystalline structure. In some embodiments, the electrical property of the second layer formed by at least one set of the combinatorial processing parameters on at least one SIR is indicative of formation of the desired crystalline structure.

In some embodiments, the second layer comprises a high-κ dielectric material. The high-κ dielectric material can be crystalline (Ba,Sr)TiO$_3$, with a first layer of Ir, SrRuO$_3$, or Ru. The high-κ dielectric material can also be rutile-phase TiO$_2$, with a first layer of MoO$_x$, RuO$_x$, or IrO$_x$.

DETAILED DESCRIPTION

Figure 1:
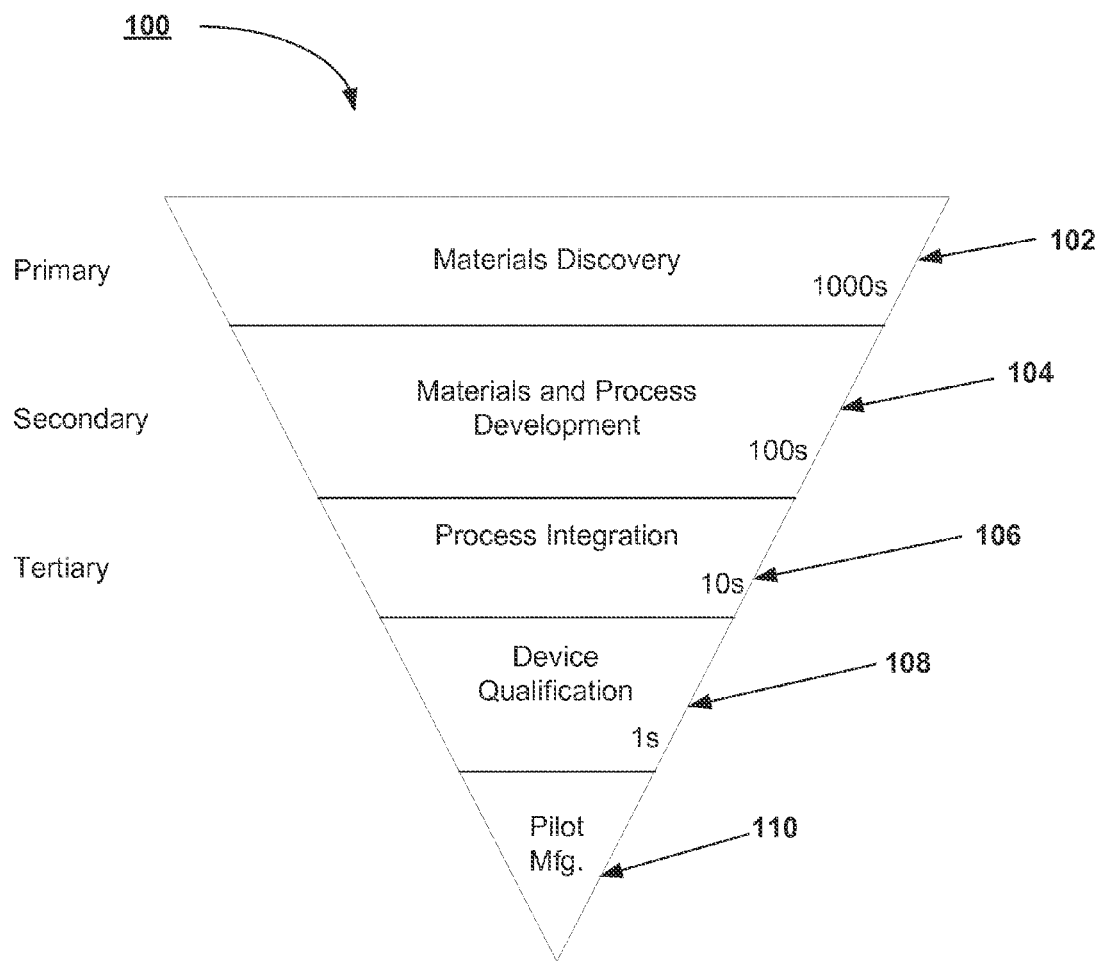
FIG. 1 is a schematic diagram for implementing combinatorial processing and evaluation.

Before the present invention is described in detail, it is to be understood that unless otherwise indicated this invention is not limited to specific coating compositions or specific substrate materials. Exemplary embodiments will be described for forming selected template layers, but layers and materials can also be used. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially" is used, the two quantities may vary from each other by no more than 5%.

Definitions:

As used herein, the term "lattice match" refers to embodiments where the lattice parameters of a formed layer are within 2% of the desired lattice parameters of a desired crystalline structure.

As used herein, the terms "film" or "layer" will be understood to refer to structures formed during semiconductor device fabrication. Such structures can be planar, as in capacitors or light emitting diodes, or three dimensional, as in transistors such as FinFETs and trigate transistors.

Embodiments of the present invention provide HPC processing techniques for the development of template materials for semiconductor devices. Template materials are used whenever it is important to form a layer having a particular crystalline structure or orientation, or to manage lattice strain near material boundaries, particularly for layers having a thickness of only a few monolayers such that any strain near boundaries may affect much of the material layer. As an exemplary, but not limiting embodiment, high-κ dielectric layers as used in such devices as DRAM capacitors and FET gate structures at the ever decreasing dimensions of new-generation devices are becoming more sensitive to such crystalline structure and orientation. An optimized template layer can provide substantial improvements in electrical parameters such as the dielectric constant of the high-κ dielectric layer, and it can be useful to optimize the template layer and dielectric layer together by HPC methods.

The performance of semiconductor devices is affected by the structure of the materials selected for use as components of the device, for example, whether the materials have an amorphous or specific crystalline structure. Examples of these semiconductor devices include electronic devices, optoelectronic devices. The materials for these devices include metals, metal alloys, conductive metal nitrides, conductive metal silicides, conductive metal oxides, or conductive metal carbides. The structure of the materials will vary with material composition and with variations in deposition technique and deposition process conditions. The structure of the materials will also vary with lattice constants of material layers with which the materials are in contact, for example, when a second material layer is formed on a first material layer. Therefore, the structure must be measured and evaluated as a function of many variables. Due to wafer-to-wafer variation, it is desirable to evaluate the influence of all of the variables on a single, or small number, of wafers. In some embodiments, methods are provided wherein the deposition technique and deposition process condition variables are varied in a combinatorial manner on a single, or small number, of wafers.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as semiconductor devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference. HPC processing techniques have been adapted to the development and investigation of absorber layers and buffer layers for TFPV solar cells as described in U.S. application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at manufacturing operations by considering interaction effects between the unit manufacturing operations, the process conditions used to effect such unit manufacturing operations, hardware details used during the processing, as well as materials characteristics of components utilized within the unit manufacturing operations to arrive at desired lattice spacing and crystal structures of device components. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating electronic and optoelectronic devices. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, semiconductor layers, conductor layers, insulator layers, diffusion barriers, work function adjustment layers, buffer layers, absorber layers, emitter layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
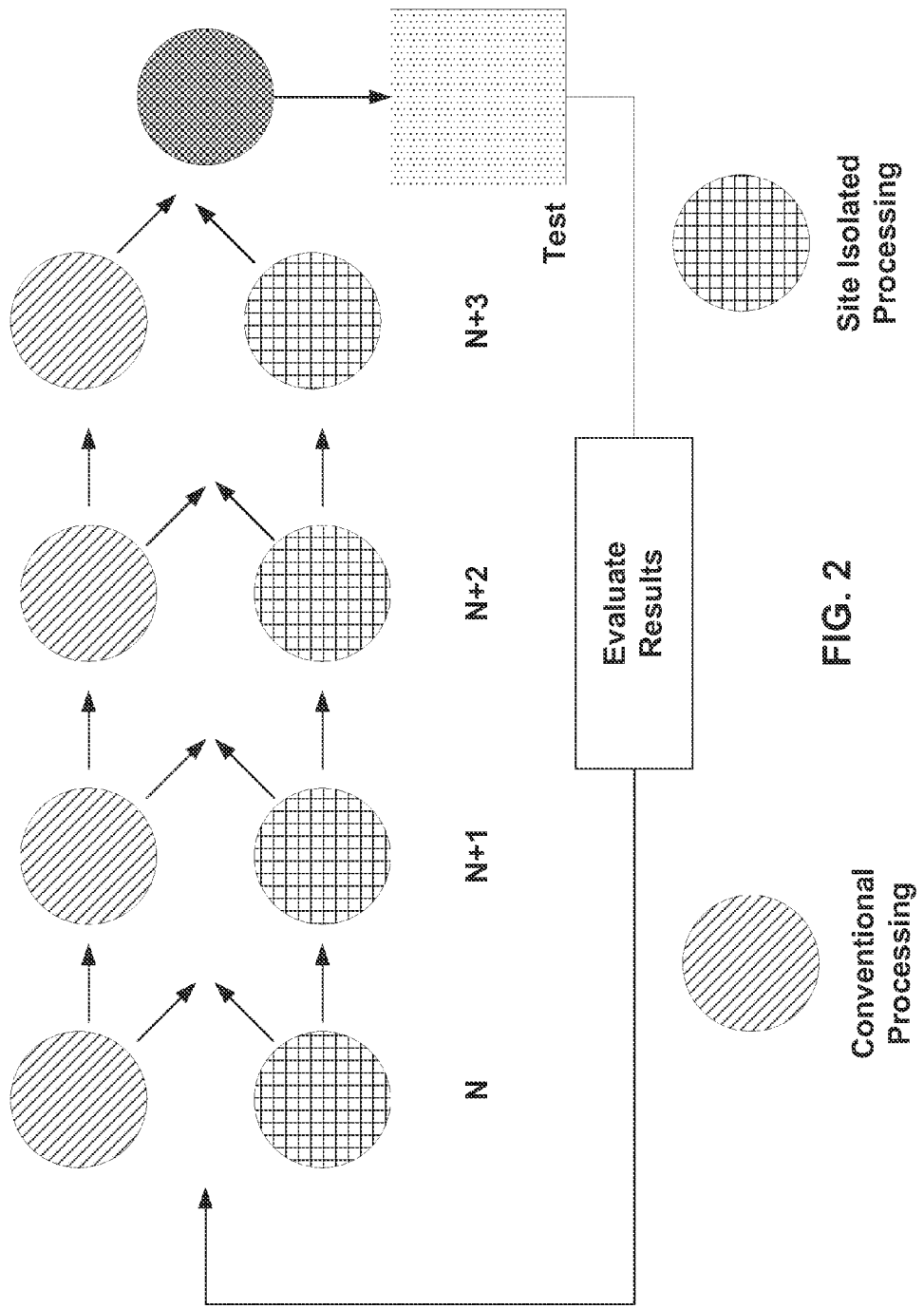
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. The combinatorial processing may employ uniform processing of site isolated regions or may employ gradient techniques. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the regions. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
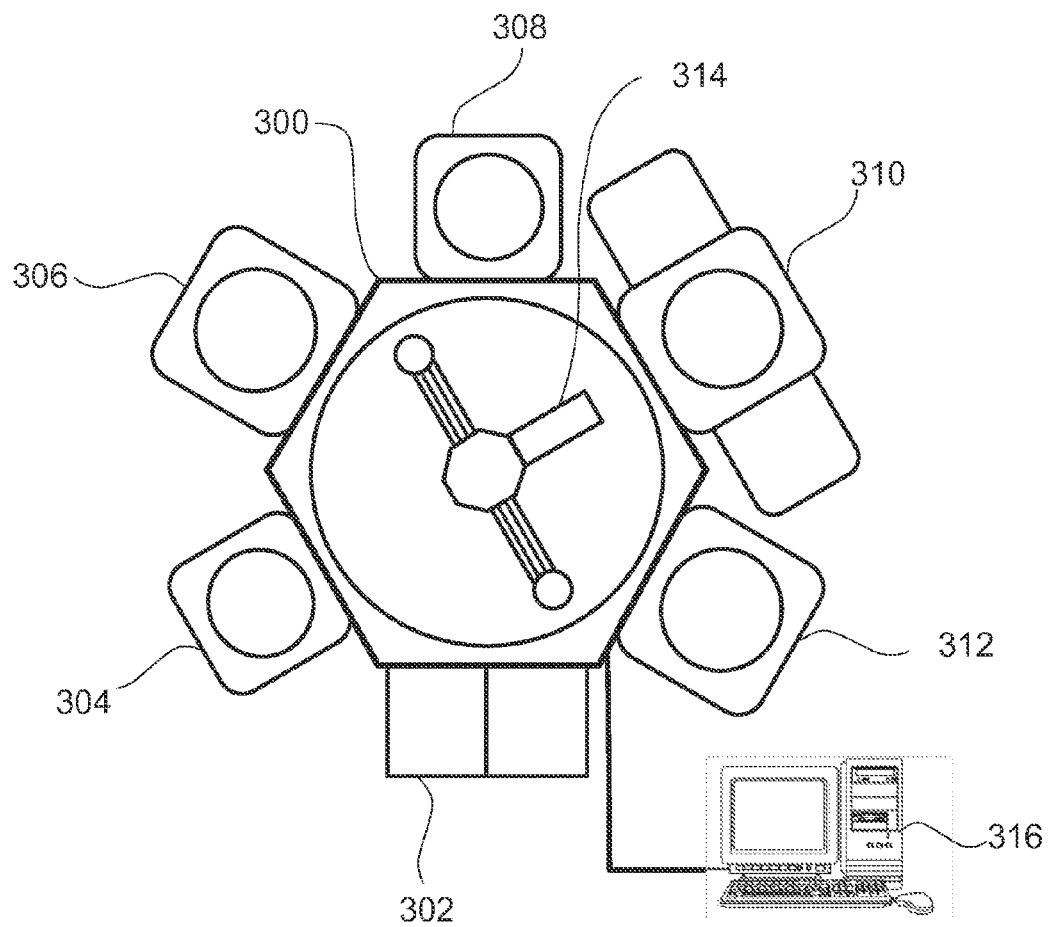
FIG. 3 is a simplified schematic diagram illustrating an integrated high productivity combinatorial (HPC) system in accordance with some embodiments.

FIG. 3 is a simplified schematic diagram illustrating an integrated high productivity combinatorial (HPC) system in accordance with some embodiments of the invention. HPC system includes a frame 300 supporting a plurality of processing modules. It should be appreciated that frame 300 may be a unitary frame in accordance with some embodiments. In some embodiments, the environment within frame 300 is controlled. Load lock/factory interface 302 provides access into the plurality of modules of the HPC system. Robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. No. 11/672,478 filed Feb. 7, 2007, now U.S. Pat. No. 7,867,904 and claiming priority to U.S. Provisional Application No. 60/832,248 filed on Jul. 19, 2006, and U.S. application Ser. No. 11/672,473, filed Feb. 7, 2007 and claiming priority to U.S. Provisional Application No. 60/832,248 filed on Jul. 19, 2006, which are all herein incorporated by reference. With HPC system, a plurality of methods may be employed to deposit material upon a substrate employing combinatorial processes.

Figure 4:
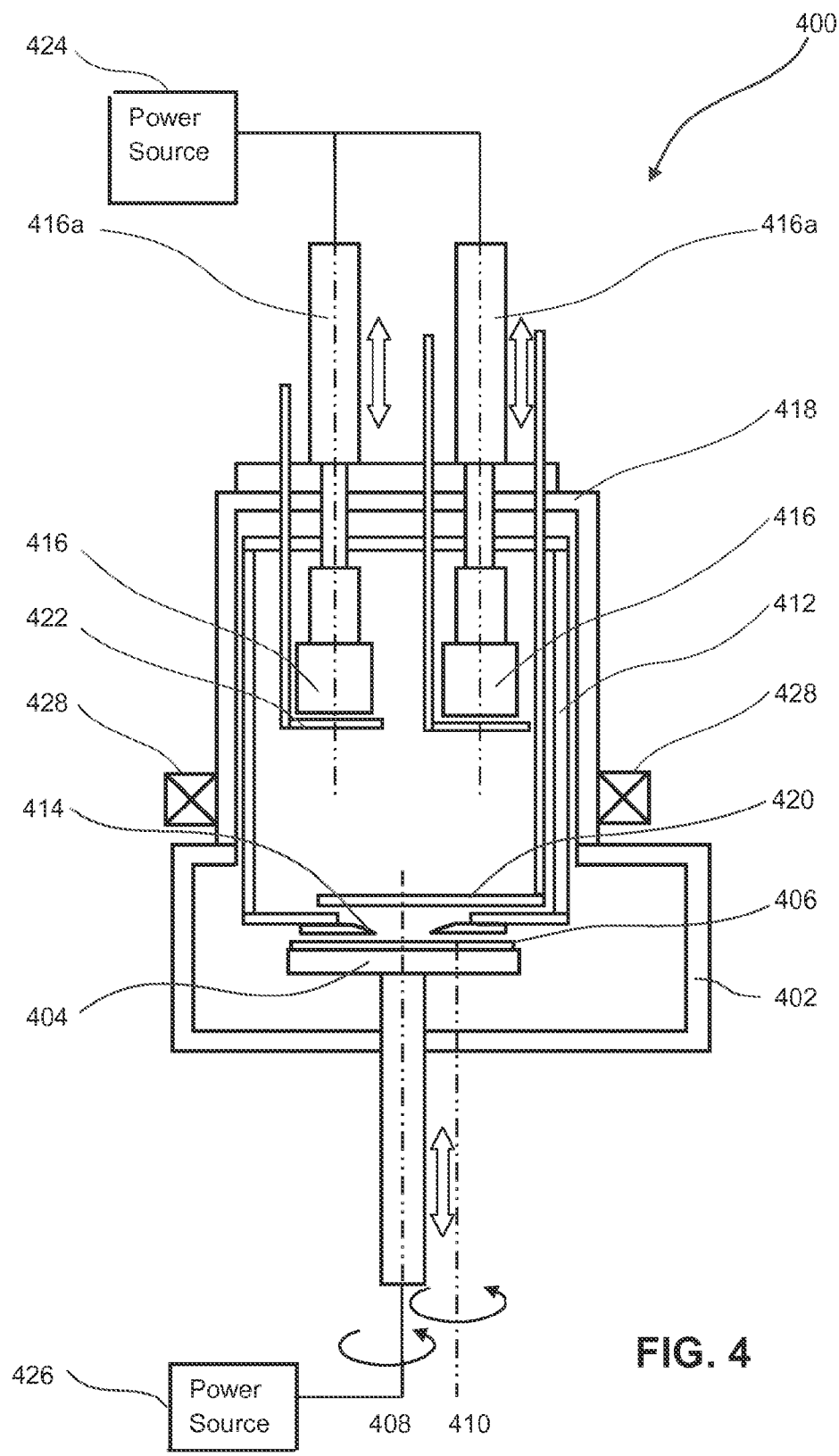
FIG. 4 is a simplified schematic diagram illustrating a sputter processing chamber configured to perform combinatorial processing and full substrate processing in accordance with some embodiments.

FIG. 4 is a simplified schematic diagram illustrating a sputter chamber configured to perform combinatorial processing and full substrate processing in accordance with some embodiments of the invention. Processing chamber, 400, includes a bottom chamber portion, 402, disposed under top chamber portion, 418. Within bottom portion, 402, substrate support, 404, is configured to hold a substrate, 406, disposed thereon and can be any known substrate support, including but not limited to a vacuum chuck, electrostatic chuck or other known mechanisms. Substrate support, 404, is capable of both rotating around its own central axis, 408 (referred to as "rotation" axis), and rotating around an exterior axis, 410, (referred to as "revolution" axis). Such dual rotary substrate support is central to combinatorial processing using site-isolated mechanisms. Other substrate supports, such as an XY table, can also be used for site-isolated deposition. In addition, substrate support, 404, may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source, 426, provides a bias power to substrate support, 404, and substrate, 406, and produces a negative bias voltage on substrate, 406. In some embodiments power source, 426, provides a radio frequency (RF) power sufficient to take advantage of the high metal ionization to improve step coverage of vias and trenches of patterned wafers. In some embodiments, the RF power supplied by power source, 426, is pulsed and synchronized with the pulsed power from power source, 424.

Substrate, 406, may be a conventional round 200 mm, 300 mm, or any other larger or smaller substrate/wafer size. In some embodiments, substrate, 406, may be a square, rectangular, or other shaped substrate. One skilled in the art will appreciate that substrate, 406, may be a blanket substrate, a coupon (e.g., partial wafer), or even a patterned substrate having predefined regions. In some embodiments, substrate, 406, may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion, 418, of chamber, 400, in FIG. 4 includes process kit shield, 412, which defines a confinement region over a radial portion of substrate, 406. Process kit shield, 412, is a sleeve having a base (optionally integrated with the shield) and an optional top within chamber, 400, that may be used to confine a plasma generated therein. The generated plasma will dislodge atoms from a target and the sputtered atoms will deposit on an exposed surface of substrate, 406, to combinatorial process regions of the substrate in some embodiments. In another embodiment, full wafer processing can be achieved by optimizing gun tilt angle and target-to-substrate spacing, and by using multiple process guns, 416. Process kit shield, 412, is capable of being moved in and out of chamber, 400, (i.e., the process kit shield is a replaceable insert). In another embodiment, process kit shield, 412, remains in the chamber for both the full substrate and combinatorial processing. Process kit shield, 412, includes an optional top portion, sidewalls and a base. In some embodiments, process kit shield, 412, is configured in a cylindrical shape, however, the process kit shield may be any suitable shape and is not limited to a cylindrical shape.

The base of process kit shield, 412, includes an aperture, 414, through which a surface of substrate, 406, is exposed for deposition or some other suitable semiconductor processing operations. Aperture shutter, 420, which is moveably disposed over the base of process kit shield, 412. Aperture shutter, 420, may slide across a bottom surface of the base of process kit shield, 412, in order to cover or expose aperture, 414, in some embodiments. In another embodiment, aperture shutter, 420, is controlled through an arm extension which moves the aperture shutter to expose or cover aperture, 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture, 414, may be a larger opening and aperture shutter, 420, may extend with that opening to either completely cover the aperture or place one or more fixed apertures within that opening for processing the defined regions. The dual rotary substrate support, 404, is central to the site-isolated mechanism, and allows any location of the substrate or wafer to be placed under the aperture, 414. Hence, the site-isolated deposition is possible at any location on the wafer/substrate.

A gun shutter, 422, may be included. Gun shutter, 422, functions to seal off a deposition gun when the deposition gun may not be used for the processing in some embodiments. For example, two process guns, 416, are illustrated in FIG. 4. Process guns, 416, are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter, 422, can be transitioned to cover and isolate the lifted process guns from the processing area defined within process kit shield, 412. In this manner, the process guns are isolated from certain processes when desired. It should be appreciated that gun shutter, 422, may be integrated with the top of the process kit shield, 412, to cover the opening as the process gun is lifted or individual gun shutter, 422, can be used for each target. In some embodiments, process guns, 416, are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion, 418, of chamber, 400, of FIG. 4 includes sidewalls and a top plate which house process kit shield, 412. Arm extensions, 416*a*, which are fixed to process guns, 416, may be attached to a suitable drive, (i.e., lead screw, worm gear, etc.), configured to vertically move process guns, 416, toward or away from a top plate of top chamber portion, 418. Arm extensions, 416*a*, may be pivotally affixed to process guns, 416, to enable the process guns to tilt relative to a vertical axis. In some embodiments, process guns, 416, tilt toward aperture, 414, when performing combinatorial processing and tilt toward a periphery of the substrate being processed when performing full substrate processing. It should be appreciated that process guns, 416, may tilt away from aperture, 414, when performing combinatorial processing in another embodiment. In yet another embodiment, arm extensions, 416*a*, are attached to a bellows that allows for the vertical movement and tilting of process guns, 416. Arm extensions, 416*a*, enable movement with four degrees of freedom in some embodiments. Where process kit shield, 412, is utilized, the aperture openings are configured to accommodate the tilting of the process guns. The amount of tilting of the process guns may be dependent on the process being performed in some embodiments.

Power source, 424, provides power for sputter guns, 416, whereas power source, 426, provides RF bias power to an electrostatic chuck. As mentioned above, the output of power source, 426, is synchronized with the output of power source, 424. It should be appreciated that power source, 424, may output a direct current (DC) power supply or a radio frequency (RF) power supply. In another embodiment the DC power is pulsed and the duty cycle is less than 30% on-time at maximum power in order to achieve a peak power of 10-15 kilowatts. Thus, the peak power for high metal ionization and high density plasma is achieved at a relatively low average power which will not cause any target overheating/cracking issues. It should be appreciated that the duty cycle and peak power levels are exemplary and not meant to be limiting as other ranges are possible and may be dependent on the material and/or process being performed.

Figure 5A:
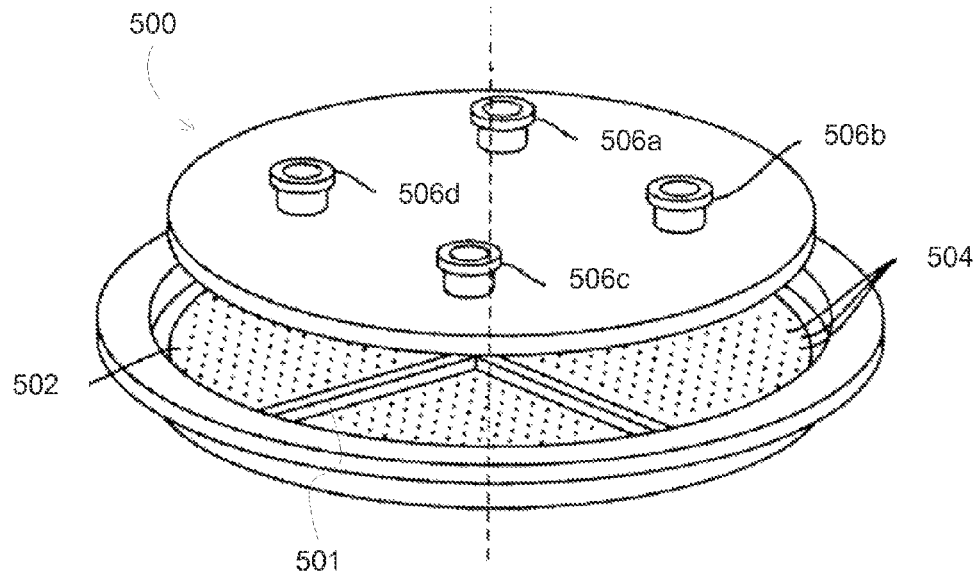
FIG. 5A illustrates an example of a large area ALD or CVD showerhead used for combinatorial processing.

FIG. 5A illustrates an example of a large area ALD or CVD showerhead, 500, used for combinatorial processing. Details of this type of showerhead and its use may be found in U.S. patent application Ser. No. 12/013,729 entitled "Vapor Based Combinatorial Processing" filed on Jan. 14, 2008 and claiming priority to Provisional Application No. 60/970,199 filed on Sep. 5, 2001, U.S. patent application Ser. No. 12/013,759 entitled "Vapor Based Combinatorial Processing" filed on Jan. 14, 2008 and claiming priority to Provisional Application No. 60/970,199 filed on Sep. 5, 2001, and U.S. patent application Ser. No. 12/205,578 entitled "Vapor Based Combinatorial Processing" filed on Sep. 5, 2008 which is a Continuation application of the U.S. patent application Ser. No. 12/013,729 and claiming priority to Provisional Application No. 60/970,199 filed on Sep. 5, 2001, all of which are herein incorporated by reference.

The large area ALD or CVD showerhead, 500, illustrated in FIG. 5A comprises four regions, 502, used to deposit materials on a substrate. As an example, in the case of a round substrate, four different materials and/or process conditions could be used to deposit materials in each of the four quadrants of the substrate (not shown). Precursor gases, reactant gases, purge gases, etc. are introduced into each of the four regions of the showerhead through gas inlet conduits 506*a*-506*b*. For simplicity, the four regions, 502, of showerhead, 500, have been illustrated as being a single chamber. Those skilled in the art will understand that each region, 502, of showerhead, 500, may be designed to have two or more isolated gas distribution systems so that multiple reactive gases may be kept separated until they react at the substrate surface. Also for simplicity, on a single gas inlet conduit, 506*a*-506*d*, is illustrated for each of the four regions. Those skilled in the art will understand that each region, 502, of showerhead, 500, may have multiple gas inlet conduits. The gases exit each region, 502, of showerhead, 500, through holes, 504, in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 5A is operable to be used with any of a CVD, PECVD, ALD, or PEALD technology.

Figure 5B:
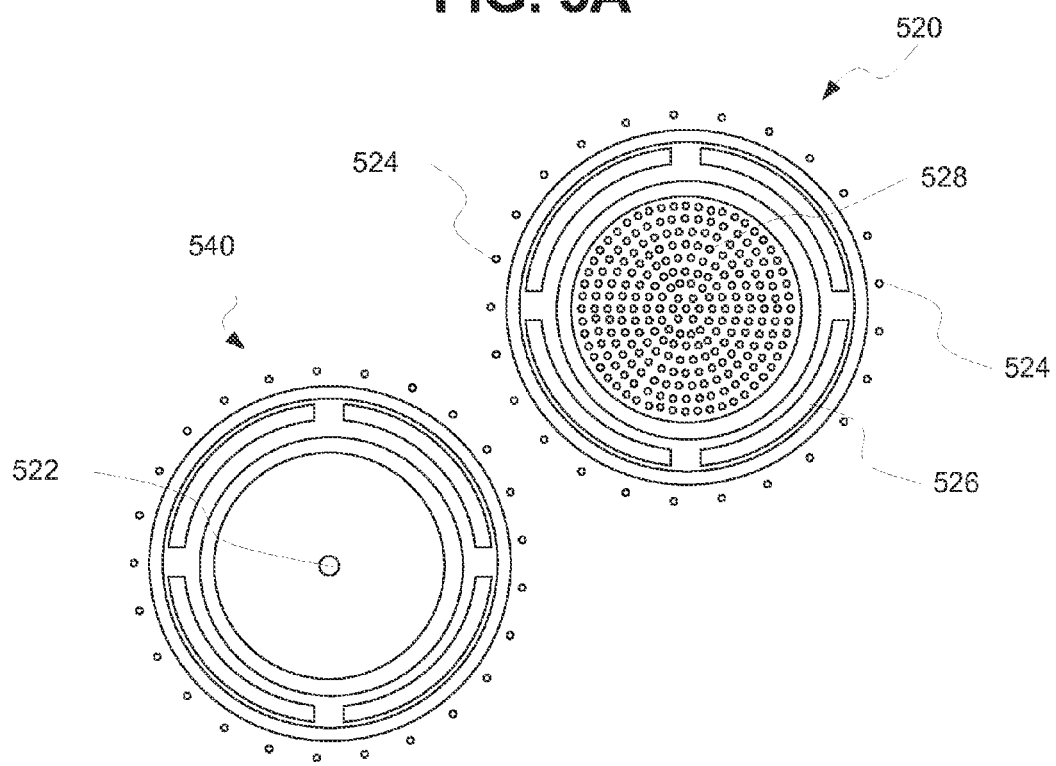
FIG. 5B illustrates a bottom view of two examples of a small spot showerhead apparatus in accordance with some embodiments.

As discussed previously, showerhead, 500, in FIG. 5A results in a deposition (or other process type) on a relatively large region of the substrate. In this example, a quadrant of the substrate. To address the limitations of the combinatorial showerhead illustrated in FIG. 5A, small spot showerheads have been designed as illustrated in FIG. 5B. FIG. 5B illustrates a bottom view of two examples of a small spot showerhead apparatus in accordance with some embodiments of the present invention. Details of the small spot showerhead and methods of its use may be found in co-owned U.S. patent application Ser. No. 13/302,097, filed on Nov. 22, 2011 and co-owned U.S. patent application Ser. No. 13/302,730, filed on Nov. 22, 2011, each of which are herein incorporated by reference for all purposes. The small spot showerhead configuration, 540, illustrated in FIG. 5B comprises a single gas distribution port, 522, in the center of the showerhead for delivering reactive gases to the surface of the substrate. The small size of the small spot showerhead and the behavior of the technologies envisioned to use this showerhead ensure that the uniformity of the process on the substrate is adequate using the single gas distribution port. However, the small spot showerhead configuration, 520, illustrated in FIG. 5B comprises a plurality of gas distribution ports, 528, for delivering reactive gases to the surface of the substrate. This configuration can be used to improve the uniformity of the process on the substrate if required.

Each small spot showerhead is surrounded by a plurality of purge holes, 524. The purge holes introduce inert purge gases (i.e. Ar, $N_2$, etc.) around the periphery of each small spot showerhead to insure that the regions under each showerhead can be processed in a site isolated manner. The gases, both the reactive gases and the purge gases, are exhausted from the process chamber through exhaust channels, 526, that surround each of the showerheads. The combination of the purge holes, 524, and the exhaust channels, 526, ensure that each region under each showerhead can be processed in a site isolated manner. The diameter of the small spot showerhead (i.e. the diameter of the purge ring) can vary between about 40 mm and about 100 mm. Advantageously, the diameter of the small spot showerhead is about 65 mm.

Using a plurality of small spot showerheads as illustrated in FIG. 5B allows a substrate to be processed in a combinatorial manner wherein different parameters can be varied as discussed above. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc.

Plasmas are widely used for a variety of treatment and layer deposition tasks in semiconductor fabrication. These applications include subtractive processes such as wafer precleaning, contaminant removal, native oxide removal, photoresist removal, as well as additive processes such as oxidation, nitridation, or hydridation of a layer both during and after formation. "Remote" plasma sources are frequently used, where the plasma generator is located at some distance from the surface to be treated or substrate on which a layer is to be formed. The distance allows some adjusting of the charged particles in the plasma. For example, the density of ions and electrons can be adjusted by distance, the electrons and ions can be filtered out from the generated plasma using suitable electrode configurations such as a grounded metal showerhead, so that, for example, only atomic radicals and molecule radicals (but not ions) reach the substrate.

Figure 6:
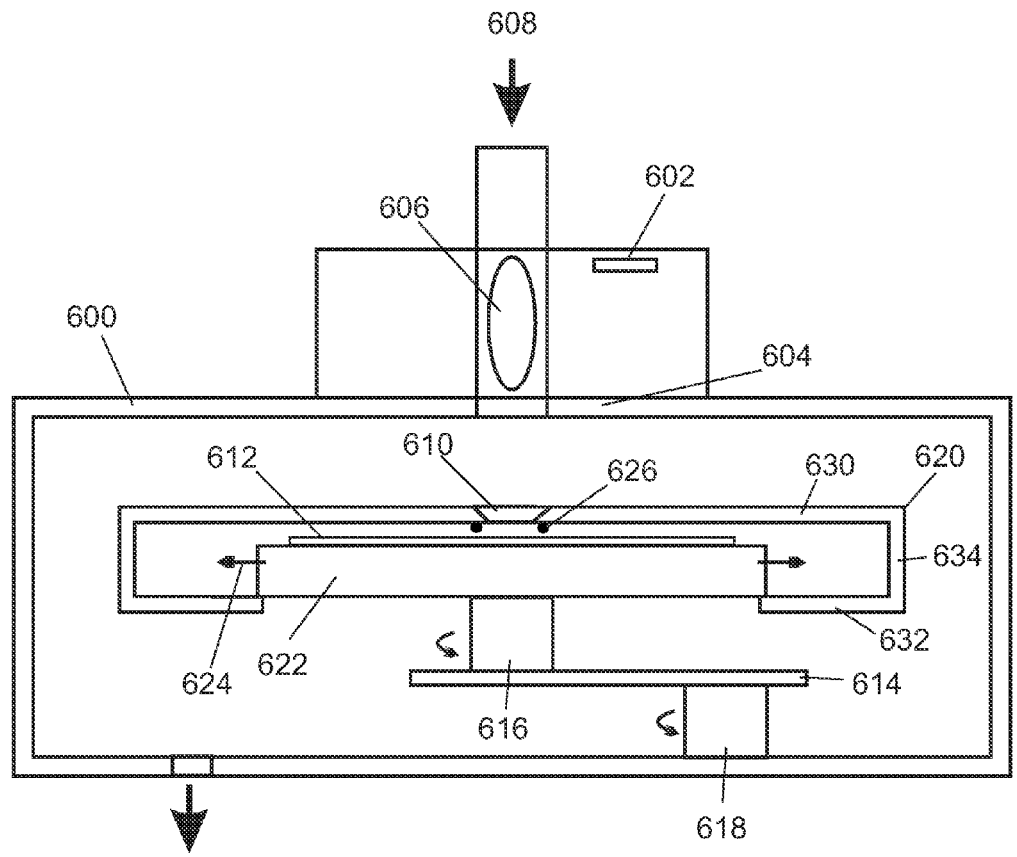
FIG. 6 is a schematic diagram of an apparatus enabling combinatorial processing using a remote plasma source.

An apparatus for combinatorial processing using remote plasma exposure of a substrate as disclosed in U.S. patent application Ser. No. 13/328,129, filed on Dec. 16, 2011, which is herein incorporated by reference, can be used for processing the SIRS on the substrate. FIG. 6 illustrates the overall layout of some embodiments of a system enabling combinatorial processing using a remote plasma source. An outer process chamber 600 is provided. A remote plasma source 602 is mounted on a chamber lid 604 either directly as illustrated or through a short flange. The plasma 606 is entrained into a central gas flow 608 which is directed toward an aperture 610. The aperture is in close proximity to a substrate 612. A substrate positioning system 614 can position any region on the substrate 612 directly under the aperture 610. As illustrated in FIG. 3, the substrate positioning system can provide two displaced axes of rotation 616 and 618. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support 622 may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

An inner chamber (also called a "process kit") 620 provides an enclosure for the substrate 612 and the substrate support 622. Substrate support 622 can be configured to hold a substrate 612 thereon, and can be any known substrate support, including but not limited to a vacuum chuck, electrostatic chuck or other known mechanisms. The shape can be selected to conveniently enclose the substrate and substrate support in all positions used; for example, it can be cylindrical. The inner chamber 620 comprises a top surface 630 parallel to the substrate 612, a bottom surface 632 below the substrate support 622, and one or more side walls 634. The top surface 630 need not be positioned close the substrate surface. The substrate 612 is shown mounted on substrate support 622. The inner chamber 620 is typically made from a material such as quartz or ceramic that is mechanically and chemically stable at process temperatures. The inner chamber (or process kit) 620 can be made of two different materials, with a center portion made of quartz or ceramic, and the edge portion made of metal. The X-Y extent of the inner chamber 620 is large enough to accommodate the substrate 612 in any position that can be achieved using the substrate positioning system.

The substrate support 622 can include a substrate heater (e.g., resistive or inductive) and can be sized to be larger than the largest substrate to be processed. Substrate temperatures for most remote plasma applications are less than 500 C, although any suitable heater power and range of temperature control. The substrate support 622 can also be configured to provide a gas purge flow 624, for example from the edges of the support, using argon, helium, or any other gas that is not reactive under the process conditions.

The aperture 610 defines the area of a site-isolated region where exposure to a plasma occurs. Barrier 626 near the edges of the site-isolated region provides control over plasma exposure, and serves to restrict plasma or reactive radical species access to regions outside the area immediately under the aperture 610. The position, shape, and height of barrier 626 can be chosen to provide maximal protection of areas of the substrate 612 for which plasma exposure is not desired. Barrier 626 can be made from a high-temperature O-ring material such as KALREZ® fluoropolymer or a refractory material such as quartz or ceramic. In some embodiments, the barrier is circular; the barrier does not have to be any particular shape, but most generally is compatible with the shape of the aperture 610. The barrier 626 can be positioned with a small gap (typically less than 0.5 mm) to the substrate 612, and the gas purge flow 624 can be adjusted so that any gas leakage under the barrier 626 is directed into the site-isolated region and out through the aperture 610.

Figure 7:
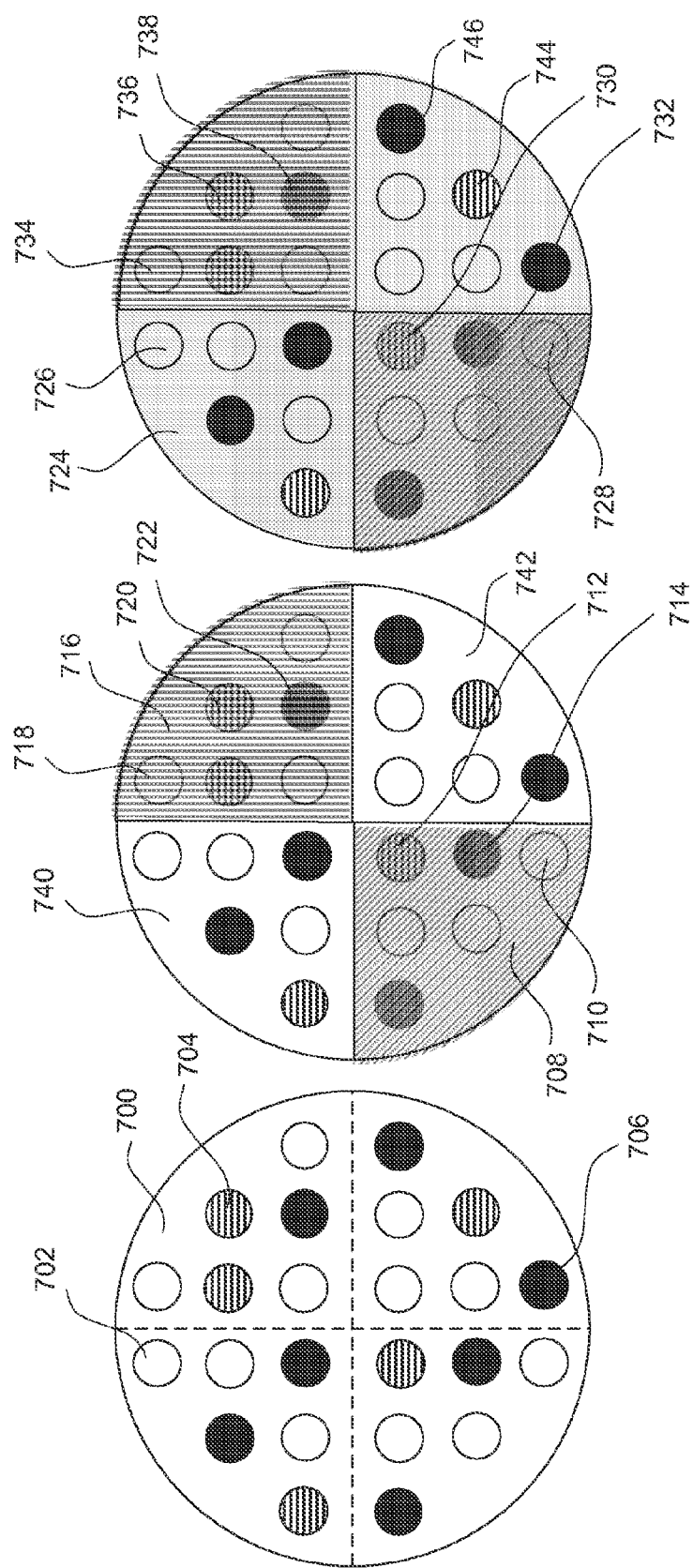
FIGS. 7A-7C illustrate a top view of site-isolated regions and film stacks formed by a PVD-ALD-CVD sequence in accordance with some embodiments.

FIG. 7 illustrates one example of a pattern of site isolated regions that can be processed using a small spot showerhead apparatus in accordance with some embodiments of the present invention. In FIG. 7, the substrate is still generally divided into four quadrants and within each quadrant, three site isolated regions can be processed using small spot showerheads as illustrated in FIG. 5B, yielding twelve site isolated regions on the substrate. Therefore, in this example, twelve independent experiments could be performed on a single substrate. FIGS. 7A-7C illustrate a top view of site-isolated regions and film stacks formed by a PVD-ALD-CVD sequence in accordance with some embodiments. FIG. 7A illustrates a substrate, 700, including a plurality of site-isolated regions (SIRs), 702. The 24 SIRs are evenly distributed into four quadrants of the substrate. Dashed lines have been added to aid in the visualization of the quadrants. Although 24 SIRs are illustrated in FIG. 7A, those skilled in the art will understand that any number of site-isolated regions may exist on the substrate. In FIG. 7A, a first number of the SIRs have been processed using a PVD technique to deposit a material, as illustrated by hatched SIRs 704. In FIG. 7A, a second number of the SIRs have been processed using a PVD technique to deposit a material, as illustrated by solid SIRs 706. Note that some of the SIRs in each quadrant of the substrate do not have material deposited on them in FIG. 7A (i.e. open SIRs 702). The materials in SIRs 704 and 706 may be different because of at least one of material composition, surface pretreatment, thickness, uniformity, or deposition conditions. Examples of deposition conditions that may be varied include power, pressure, sputtering gas composition, substrate temperature, substrate bias, target to substrate distance, or power supply frequency. As discussed previously, the thickness of the materials deposited in SIRs 704 and 706 is greater than about 60 Å. This thickness ensures that the work function derived from measurements made in these regions is dominated by the materials deposited in this step and will not be affected by materials deposited in later processing steps.

In some embodiments, the substrate may be transferred to an ALD chamber without being exposed to the ambient using a system as described in FIG. 3. In some embodiments, the substrate may be transferred to a stand-alone ALD chamber. In FIG. 7B, a first quadrant of the substrate has been processed using an ALD technique to deposit a material, as illustrated by hatched quadrant 708. In FIG. 7B, a second quadrant of the substrate has been processed using an ALD technique to deposit a material, as illustrated by hatched quadrant 716. Note that two of the quadrants of the substrate do not have material deposited on them in FIG. 7B (i.e. open quadrants 740 and 742). The materials in quadrants 708 and 716 may be different because of at least one of material composition, surface pretreatment, thickness, uniformity, or deposition conditions. Examples of deposition conditions that may be varied include pressure, precursor composition, reactant composition, substrate temperature, precursor pulse time, reactant pulse time, precursor flow rate, reactant flow rate, or precursor-reactant pulse sequences. In FIG. 7B, some SIRs have only the first ALD material deposited in them (i.e. SIRs 710). In FIG. 7B, some SIRs have the first ALD material and the first PVD material deposited in them (i.e. SIRs 712). In FIG. 7B, some SIRs have the first ALD material and the second PVD material deposited in them (i.e. SIRs 714). In FIG. 7B, some SIRs have only the second ALD material deposited in them (i.e. SIRs 718). In FIG. 7B, some SIRs have the second ALD material and the first PVD material deposited in them (i.e. SIRs 720). In FIG. 7B, some SIRs have the second ALD material and the second PVD material deposited in them (i.e. SIRs 722). As discussed previously, the thickness of the materials deposited in SIRs 710 and 718 is greater than about 60 A. This thickness ensures that the work function derived from measurements made in these regions is dominated by the materials deposited in this step and will not be affected by materials deposited in later processing steps.

In some embodiments, the substrate may be transferred to a CVD chamber without being exposed to the ambient using a system as described in FIG. 3. In some embodiments, the substrate may be transferred to a stand-alone CVD chamber. In FIG. 7C, the entire substrate has been processed using a CVD technique to deposit a material, as illustrated by shading 724. In FIG. 7C, some SIRs have only the CVD material deposited in them (i.e. SIRs 726). In FIG. 7C, some SIRs have the CVD material and the first PVD material deposited in them (i.e. SIRs 744). In FIG. 7C, some SIRs have the CVD material and the second PVD material deposited in them (i.e. SIRs 746). In FIG. 7C, some SIRs have the CVD material and the first ALD material deposited in them (i.e. SIRs 728). In FIG. 7C, some SIRs have the CVD material and the second ALD material deposited in them (i.e. SIRs 734). In FIG. 7C, some SIRs have the CVD material, the first ALD material, and the first PVD material deposited in them (i.e. SIRs 730). In FIG. 7C, some SIRs have the CVD material, the first ALD material, and the second PVD material deposited in them (i.e. SIRs 732). In FIG. 7C, some SIRs have the CVD material, the second ALD material, and the first PVD material deposited in them (i.e. SIRs 736). In FIG. 7C, some SIRs have the CVD material, the second ALD material, and the second PVD material deposited in them (i.e. SIRs 738). The thickness of the materials deposited in SIRs 726 can vary. In some embodiments, the layer is less than 1 nm in thickness.

Embodiments of the present invention provide methods of rapidly developing process flows for forming templated layers. Typically, template layers can be made from one to a few monolayers in thickness and are deposited with only enough thickness to serve the required template function. In some embodiments, the template layer can have a thickness as required for a component of a semiconductor device. For example, the template layer can serve as a conducting layer in a capacitor stack; where such a capacitor forms part of a semiconductor device, the template layer can be sufficiently thick to function appropriately.

As noted in the Background section, templated layers are particularly important in the context of forming the very thin high-κ dielectric layers such as those used for DRAM capacitors and FET gate structures at ever-decreasing feature sizes. Templated layers can also be valuable for larger structures when there is an inherent large mismatch between a deposited layer and an underlying substrate. Such a mismatch can exist, for example, when forming GaN and InGaN layers for the manufacture of LEDs.

Template layers can serve a variety of useful functions. Typically, the primary function of a template layer is to promote the growth of a desired crystalline structure and orientation in a subsequently deposited layer. In this role, a template layer serves a similar function to a seed layer. A template layer can also serve as a barrier layer to prevent interdiffusion between adjacent layers on both sides. A template layer ultimately becomes an integral part of the finished device. If insulating, it becomes part of a dielectric stack; if conducting, it becomes part of an adjacent electrode, possibly serving a work-function-adjustment role.

Because all of the layers in modern semiconductor devices can be very thin, bulk material properties are frequently not useful to describe actual device performance. Crystal defects, contaminants, interdiffusion between layers—anything which causes layer structure to deviate even slightly from an ideal structure—can degrade device performance, and such effects can be a sensitive function of process parameters used to form any of the layers. Thus, it is often not sufficient to select template layer materials based on bulk properties from handbook data in order to predict ultimate device performance. Rather, one must experimentally optimize process parameters, a time consuming and expensive process.

Figure 8:
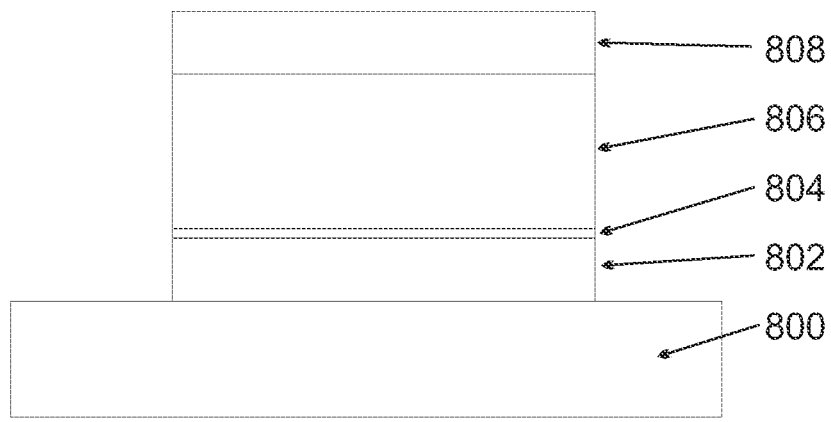
FIG. 8 illustrates a MIM capacitor stack.

Accordingly, the use of combinatorial methods provides methods of rapidly screening large numbers of process parameters related to both the formation of a template layer 804 and to the formation of a templated layer 806 (the layer formed on the template layer), as illustrated by example for a capacitor stack in FIG. 8. A bottom electrode layer 802 is deposited on a substrate 800. The template layer 804 is deposited on the bottom electrode. A templated layer 806 is deposited on the template layer 804. A top electrode layer 808 can be deposited on the templated layer. In some embodiments, the bottom electrode layer may serve as the template layer.

Figure 9:
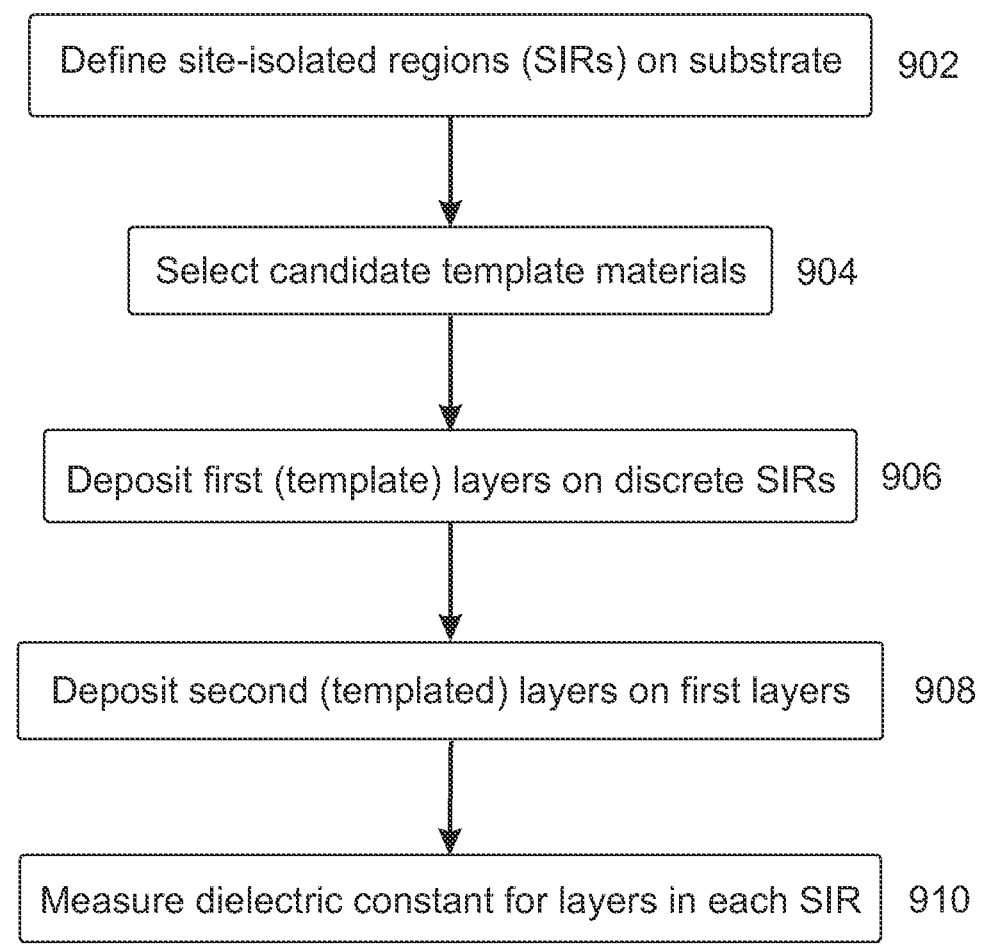
FIG. 9 illustrates a flow chart describing a method for fabricating a capacitor stack in accordance with some embodiments.

FIG. 9 shows a process flow 900 according to some embodiments for HPC processing of template and templated layers. A plurality of discrete site-isolated regions (SIRs) are defined 902 on a substrate. One or more materials are selected 904 having a crystalline structure to be tested as a first layer such that the first layer may function as a template layer 804 for a second layer 806 of a desired composition and crystalline structure. These materials can be selected initially based on handbook values of bulk properties. In some embodiments, materials can be selected randomly. Depending on actual process conditions, the material may or may not successfully function as a template layer; some material layers will function better than others, and the characteristics of a given material layer cannot be predicted based solely on bulk properties. The first layer can then be formed 906 on one of the discrete SIRs, and the second layer can be formed 908 on the first layer. The process parameters for the formation of the first layer can be varied in a combinatorial manner between different discrete SIRs. Typically, the process parameters for the formation of the second layer can also be varied in a combinatorial manner between the different discrete SIRs.

In some embodiments, the first layer is formed by physical vapor deposition (PVD) in a system operable to deposit layers of varying composition in different discrete SIRs. In some embodiments, the first layer is formed by ALD or CVD in a system operable to deliver varying gas compositions to different discrete SIRs. In some embodiments, the first layer can be formed or treated with a plasma in a system operable to deliver varying plasma compositions or energies to different discrete SIRs. In some embodiments, the first layer can be treated with heat in a system operable to deliver controlled heating to different discrete SIRs. In some embodiments, the first layer can be treated with cooling in a system operable to deliver controlled cooling to different discrete SIRs. In some embodiments, the second layer can be formed by atomic layer deposition (ALD) or chemical vapor deposition (CVD) in a system operable to deliver varying gas compositions to different discrete SIRs. In some embodiments, the second layer is formed by physical vapor deposition (PVD) in a system operable to deposit layers of varying composition in different discrete SIRs. In some embodiments, the second layer can be formed or treated with a plasma in a system operable to deliver varying plasma compositions or energies to different discrete SIRs.

Once the second layer is formed, the effect of each process variation can be tested 910, for example by measuring the dielectric constant of the stack. Other measurements can also be used such as X-ray diffraction (XRD) or electron diffraction can be used to determine lattice parameters. In some processes, Extended X-ray Absorption Fine Structure (EX-AFS) can be used to detect short-range order when XRD shows no peaks indicating long-range order. Electrical measurements can be used to determine EOT and the effective dielectric constant. In some processes, the electrical measurements can be more sensitive to changes in crystal parameters than XRD. For example, for a $TiO_2$ layer deposited by PVD on $RuO_2$, no peak was detected in XRD, but electrical evaluation showed a κ value indicative of rutile $TiO_2$. If the device to be constructed is an optoelectronic device, optical performance measurements can also be used to characterize each variation of the second layer. The results of a round of combinatorial testing are typically not exhaustive in that the number of experiments that can be conducted on one wafer is limited by the number of SIRs that can be created on one wafer. Thus, experiments can be staged such that the results of testing on the SIRs on one wafer (or several wafers) can guide the choice of parameters and materials to be tested on subsequent wafers.

Typical electrical measurements can comprise measuring capacitance as a function of applied voltage (i.e., determining a C-V curve), measuring current as a function of applied voltage (i.e., determining an I-V curve), measuring the κ value of the dielectric material, measuring the equivalent oxide thickness (EOT) of the dielectric material, measuring the concentration and energy levels of traps or interface states, measuring the concentration and mobility of charge carriers, etc.

Referring back to FIG. 7, the methods described above can be applied to the development of metal-insulator-metal (MIM) capacitor stacks. In their simplest configuration, MIM capacitor stacks comprise a bottom electrode layer, a template layer, a dielectric layer, and a top electrode layer. In some embodiments, bottom electrode layers are formed having substantially identical composition and thickness in each of the SIRs illustrated in FIGS. 7A-7C. In some embodiments, many capacitors with different areas are formed within each SIR so that data may be obtained and indications of how the material properties and the device performance scale with capacitor area can be obtained. In some embodiments, the substrate is then processed through sequential deposition techniques including PVD, ALD, and CVD as illustrated in FIGS. 7A-7C wherein the material and/or the process conditions are varied in a combinatorial manner between the various SIRs on the substrate for each of a first (template) layer and a second (templated) layer. In some embodiments, at least two of the deposition techniques are performed without removing the substrate from a cluster processing system as illustrated in FIG. 3. In some embodiments, all of the deposition techniques are performed in stand-alone processing systems. Top electrode layers can then be formed on the second layer in each of the SIRs, where the second layers in each SIR have substantially identical composition and thickness.

Any semiconductor processing method can be used to for each of the first and second layer including wet and dry processing methods, provided that the method is adapted to form layers in a site-isolated manner. Examples of dry deposition techniques include batch or in-line (co)evaporation, batch or in-line PVD (sputtering), ALD, CVD, Plasma enhanced CVD (PECVD), Plasma enhanced ALD (PEALD), plasma treatments such as cleaning and atomic migration, atmospheric pressure CVD (APCVD), ultra-fast atmospheric ALD, etc. Examples of wet deposition techniques include plating, printing or spraying of inks, screen printing, inkjet printing, slot die coating, gravure printing, or wet chemical depositions.

In some embodiments, thermal treatments can also be implemented in a site-isolated manner on discrete SIRs as taught it [IM0702]. One or more layers can be heated during or after the layer is formed in a system operable to deliver varying heat treatment or energies to different discrete SIRs. In some embodiments, one or more layers can also be cooled during or after the layer is formed in a system operable to control temperature of different discrete SIRs.

The methods can further comprise measuring lattice parameters of the first layer and comparing them to lattice parameters of the desired crystalline structure. In some embodiments, the lattice parameters of the first layer formed by at least one set of the combinatorial processing parameters are within 2% of the lattice parameters of the desired crystalline structure. Layers of particular interest include high-κ dielectric materials.

In one exemplary application of the instant invention, it is desired to form improved layers of $SrTiO_3$ or $(Ba,Sr)TiO_3$ for use as a high-κ dielectric for DRAM capacitors at, for example, 22 nm feature size. $SrTiO_3$ layers can be formed by ALD as alternating layers of, for example, SrO and $TiO_2$ with a subsequent annealing step, as disclosed in U.S. Pat. No. 8,202,808 B2 to Matz et al. This process creates the desired crystalline layer structure. However, in the absence of an optimized template layer, the dielectric constant of the resulting layer can be at least an order of magnitude smaller than that of the bulk material as shown in FIG. 8A of Matz, where dielectric constants of 30-50 are shown for selected processing conditions and layer thicknesses compared to a handbook value for bulk material of 300. A variety of template materials have been tested to increase the effective dielectric constant of $SrTiO_3$ or $(Ba,Sr)TiO_3$. Examples include Ir, $SrRuO_3$, Ru, $RuO_2$. Template layers of these materials can be formed by PVD, CVD, and ALD—most generally, all three processes can be explored combinatorially to find a process that provides optimal, or at least satisfactory performance at the lowest cost. In some embodiments, the first layer comprises Ir, $SrRuO_3$, Ru, or $RuO_2$.

For example, PVD can be used to form a template layer comprising Ir, and $SrTiO_3$ layers can be formed by ALD as alternating layers of, for example, SrO and $TiO_2$ with a subsequent annealing step. PVD process parameters that can be varied to include, but are not limited to, process material amounts, reactant species, processing temperatures, processing times, processing pressures, substrate bias, substrate temperature, magnetron power, atmospheres in which the processes are conducted, order in which materials are deposited, etc. In particular, PVD process parameters can be varied to test which process parameters provide desired template layer composition, layer thickness, layer uniformity, crystallinity, crystal orientation, grain size, electrical properties (such as resistivity and dielectric constant), reproducibility, variability with respect to SIR location within a wafer, etc.

In another exemplary application of the instant invention, it is desired to form improved layers of rutile-phase $TiO_2$ for use as a high-κ dielectric for DRAM capacitors. Rutile-phase $TiO_2$ has a significantly higher dielectric constant than anatase-phase $TiO_2$ which can form preferentially under some processing conditions. The use of an appropriate template layer can cause preferential formation of the rutile phase. Candidate template materials include oxides of Mo, Ru, and Ir. For example, in some embodiments, the first layer comprises $MoO_x$, $RuO_x$, or $IrO_x$. Combinatorial processing parameters of particular interest may include precursor species, sputtering target composition, substrate temperature, gas composition during layer formation or annealing, gas pressure during layer formation or annealing, % oxygen during layer formation or annealing, use of plasmas, and so forth.

In still another exemplary application of the instant invention, it is desired to form GaN and/or InGaN layers for the manufacture of blue LEDs. These materials have a very poor lattice match with Si substrates, and a template layer is needed to avoid excessive lattice strain in the deposited layers. A suitable template material is AlN. The AlN can be formed using combinatorially varied processing parameters to determine appropriate processing conditions for forming the desired lattice structure.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A method of forming layers comprising
defining a plurality of site-isolated regions (SIRs) on a substrate,
forming a first layer on one or more of the SIRs,
forming a second layer on the first layer,
wherein the first layer may function as a template layer for the second layer;
measuring a property of the second layer;
wherein process parameters for the formation of the first layer are varied in a combinatorial manner between different SIRs.

2. The method of claim 1, wherein the process parameters comprise one or more of process material amounts, reactant species, precursor species, processing temperatures, processing times, processing pressures, substrate bias, substrate temperature, sputtering target composition, magnetron power, atmospheres in which the processes are conducted, plasma composition, plasma energy, or the order in which materials are deposited.

3. The method of claim 1, wherein the property of the second layer is at least one of a lattice parameter or an electrical property.

4. The method of claim 3, further comprising comparing the measured lattice parameter to lattice parameters of a desired crystalline structure or comparing the measured electrical property to an electrical property correlated with the formation of a desired crystalline structure.

5. The method of claim 3, wherein the measuring a lattice parameter or an electrical property of the second layer is performed on the combined first and second layers.

6. The method of claim 1, further comprising measuring a lattice parameter or an electrical property of the first layer.

7. The method of claim 1, wherein one or more layers are formed by atomic layer deposition (ALD) or chemical vapor deposition (CVD) in a system operable to deliver varying gas compositions to different SIRs.

8. The method of claim 1, wherein one or more layers are formed by physical vapor deposition (PVD) in a system operable to deposit layers of varying composition in different SIRs.

9. The method of claim 1, wherein one or more layers are formed by plasma deposition in a system operable to deliver varying plasma compositions or energies to different SIRs.

10. The method of claim 1, wherein one or more layers are treated with a plasma in a system operable to deliver varying plasma compositions or energies to different SIRs.

11. The method of claim 1, wherein one or more layers are heated during or after the forming in a system operable to deliver varying heat treatment or energies to different SIRs.

12. The method of claim 1, wherein one or more layers are cooled during or after the forming in a system operable to control temperature of different SIRs.

13. The method of claim 1, wherein lattice parameters of the second layer formed by at least one set of the combinatorial processing parameters on at least one SIR are within 2% of lattice parameters of a desired crystalline structure.

14. The method of claim 1, wherein an electrical property of the second layer formed by at least one set of the combinatorial processing parameters on at least one SIR is indicative of formation of a desired crystalline structure.

15. The method of claim 1, wherein the second layer comprises a high-κ dielectric material.

16. The method of claim 15, wherein the high-κ dielectric material is crystalline $(Ba,Sr)TiO_3$, and the first layer comprises Ir, $SrRuO_3$, or Ru.

17. The method of claim 15, wherein the high-κ dielectric material is rutile-phase $TiO_2$, and the first layer comprises $MoO_x$, $RuO_x$, or $IrO_x$.

18. The method of claim 1, wherein the process parameters for the formation of the second layer are varied in a combinatorial manner between the different discrete SIRs.

19. The method of claim 18, wherein the process parameters comprise process material amounts, reactant species, precursor species, processing temperatures, processing times, processing pressures, substrate bias, substrate temperature, sputtering target composition, magnetron power, atmospheres in which the processes are conducted, plasma composition, plasma energy, order in which materials are deposited.

\* \* \* \* \*